(12) United States Patent
Wang et al.

(10) Patent No.: US 12,232,425 B2
(45) Date of Patent: *Feb. 18, 2025

(54) MAGNETORESISTIVE RANDOM ACCESS MEMORY

(71) Applicant: UNITED MICROELECTRONICS CORP., Hsin-Chu (TW)

(72) Inventors: Hui-Lin Wang, Taipei (TW); Si-Han Tsai, Taichung (TW); Dong-Ming Wu, Taichung (TW); Chen-Yi Weng, New Taipei (TW); Ching-Hua Hsu, Kaohsiung (TW); Ju-Chun Fan, Tainan (TW); Yi-Yu Lin, Taichung (TW); Che-Wei Chang, Taichung (TW); Po-Kai Hsu, Taichung (TW); Jing-Yin Jhang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/515,273

(22) Filed: Nov. 21, 2023

(65) Prior Publication Data

US 2024/0099154 A1 Mar. 21, 2024

Related U.S. Application Data

(63) Continuation of application No. 17/348,776, filed on Jun. 16, 2021, now Pat. No. 11,864,468.

(30) Foreign Application Priority Data

May 17, 2021 (CN) .......................... 202110533886.6

(51) Int. Cl.
*G11C 11/00* (2006.01)
*G11C 11/16* (2006.01)
(Continued)

(52) U.S. Cl.
CPC .......... *H10N 50/10* (2023.02); *G11C 11/161* (2013.01); *H01F 10/3254* (2013.01);
(Continued)

(58) Field of Classification Search
CPC .................................................. G11C 11/161
See application file for complete search history.

(56) References Cited

U.S. PATENT DOCUMENTS 7,195,929 B2 3/2007 Park
11,011,210 B2 5/2021 Hsu
(Continued)

OTHER PUBLICATIONS

Park et al., Title: A novel integration of STT-MRAM for on-chip hybrid memory by utilizing non-volatility modulation, IEDM, 2019.

*Primary Examiner* — Pho M Luu
(74) *Attorney, Agent, or Firm* — Winston Hsu

(57) ABSTRACT

A magnetoresistive random access memory (MRAM) device includes a first array region and a second array region on a substrate, a first magnetic tunneling junction (MTJ) on the first array region, a first top electrode on the first MTJ, a second MTJ on the second array region, and a second top electrode on the second MTJ. Preferably, the first top electrode and the second top electrode include different nitrogen to titanium (N/Ti) ratios.

5 Claims, 5 Drawing Sheets

(51) Int. Cl.
- *H01F 10/32* (2006.01)
- *H10B 61/00* (2023.01)
- *H10N 50/10* (2023.01)
- *H10N 50/80* (2023.01)
- *H10N 50/85* (2023.01)

(52) U.S. Cl.
CPC ............. *H10B 61/00* (2023.02); *H10N 50/80* (2023.02); *H10N 50/85* (2023.02)

(56) References Cited

U.S. PATENT DOCUMENTS

| | | | |
|---|---|---|---|
| 11,864,468 B2 * | 1/2024 | Wang | H10N 50/10 |
| 2019/0164584 A1 * | 5/2019 | Chuang | H10N 50/85 |
| 2019/0378971 A1 * | 12/2019 | Chu | H10N 50/80 |
| 2020/0006628 A1 | 1/2020 | O'Brien | |
| 2020/0075669 A1 * | 3/2020 | Chuang | H10N 50/10 |
| 2022/0384710 A1 | 12/2022 | Yi | |

* cited by examiner

MAGNETORESISTIVE RANDOM ACCESS MEMORY

CROSS REFERENCE TO RELATED APPLICATIONS

This application is a continuation application of U.S. application Ser. No. 17/348,776 (U.S. Pat. No. 11,864,468), filed on Jun. 16, 2021. The content of the application is incorporated herein by reference.

BACKGROUND OF THE INVENTION

1. Field of the Invention

The invention relates to a semiconductor device, and more particularly to a magnetoresistive random access memory (MRAM).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a magnetoresistive random access memory (MRAM) device includes a first array region and a second array region on a substrate, a first magnetic tunneling junction (MTJ) on the first array region, a first top electrode on the first MTJ, a second MTJ on the second array region, and a second top electrode on the second MTJ. Preferably, the first top electrode and the second top electrode include different nitrogen to titanium (N/Ti) ratios.

According to another aspect of the present invention, a magnetic random access memory (MRAM) device includes a first array region and a second array region on a substrate, a first magnetic tunneling junction (MTJ) on the first array region, a first spacer adjacent to the first MTJ, a second MTJ on the second array region, and a second spacer adjacent to the second MTJ. Preferably, the first spacer and the second spacer include different thicknesses.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
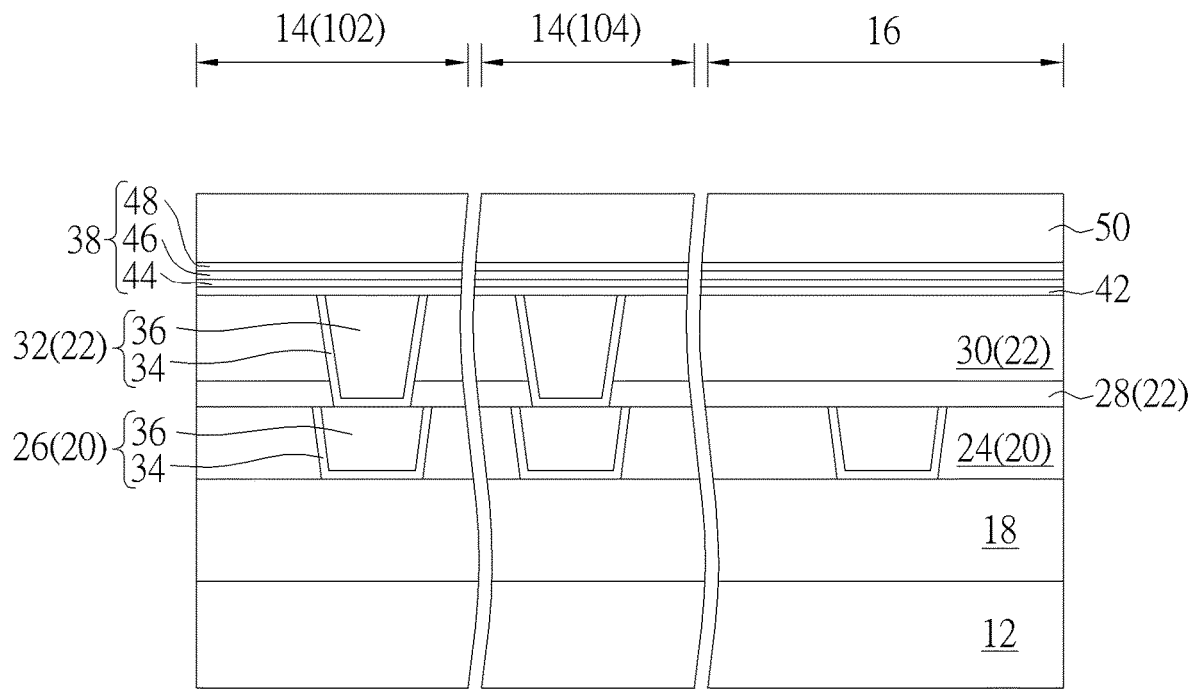
FIGS. 1-5 illustrate a method for fabricating a MRAM device according to an embodiment of the present invention.

Referring to FIGS. 1-5, FIGS. 1-5 illustrate a method for fabricating a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs). A MRAM region 14 and a logic region 16 are defined on the substrate 12, in which the MRAM region 14 further includes a plurality of array regions including an array region 102 and an array region 104.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MRAM region 14 and the logic region 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnections 32 embedded in the stop layer 28 and the IMD layer 30.

In this embodiment, each of the metal interconnections 26 from the metal interconnect structure 20 preferably includes a trench conductor and the metal interconnection 32 from the metal interconnect structure 22 on the MRAM region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further include a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 in the metal interconnections 26 are preferably made of copper, the metal layer 36 in the metal interconnections 32 are made of tungsten, the IMD layers 24, 30 are preferably made of silicon oxide such as tetraethyl orthosilicate (TEOS), and the stop layer 28 is preferably made of nitrogen doped carbide (NDC), silicon nitride, silicon carbon nitride (SiCN), or combination thereof.

Next, a bottom electrode 42, a MTJ stack 38 or stack structure, a top electrode 50, and a patterned mask (not shown) are formed on the metal interconnect structure 22. In this embodiment, the formation of the MTJ stack 38 could be accomplished by sequentially depositing a pinned layer 44, a barrier layer 46, and a free layer 48 on the bottom electrode 42. In this embodiment, the bottom electrode layer 42 and the top electrode layer 50 are preferably made of conductive material including but not limited to for example Ta, Pt, Cu, Au, Al, or combination thereof. The pinned layer 44 could be made of ferromagnetic material including but not limited to for example iron, cobalt, nickel, or alloys thereof such as cobalt-iron-boron (CoFeB) or cobalt-iron (CoFe). Alternatively, the pinned layer 44 could also be made of antiferromagnetic (AFM) material including but not limited to for example ferromanganese (FeMn), platinum manganese (PtMn), iridium manganese (IrMn), nickel oxide (NiO), or combination thereof, in which the pinned layer 44 is formed to fix or limit the direction of magnetic moment of adjacent layers. The barrier layer 46 could be made of insulating material including but not limited to for example oxides such as aluminum oxide ($AlO_x$) or magnesium oxide (MgO). The free layer 48 could be made of ferromagnetic material including but not limited to for example iron, cobalt, nickel, or alloys thereof such as cobalt-iron-boron (CoFeB), in which the magnetized direction of the free layer 48 could be altered freely depending on the influence of outside magnetic field.

Figure 2:
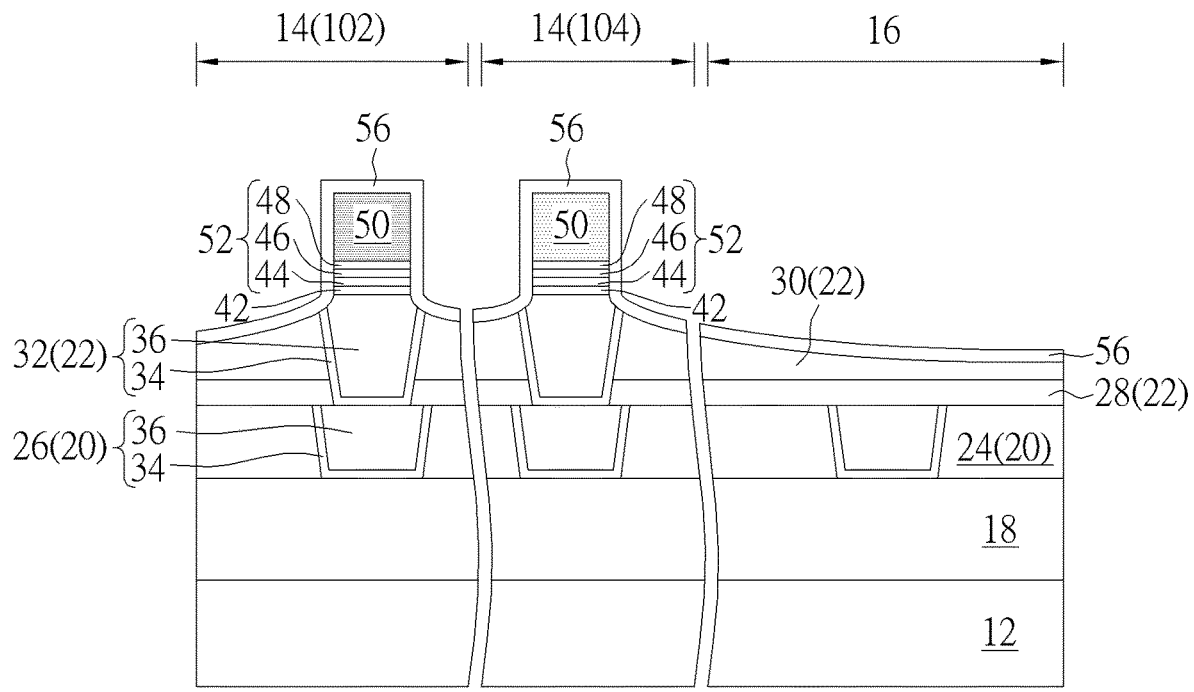

Next, as shown in FIG. 2, one or more etching process is conducted by using the patterned mask as mask to remove part of the top electrode 50, part of the MTJ stack 38, part of the bottom electrode 42, and part of the IMD layer 30 to form MTJs 52 on the MRAM region 14. It should be noted that a reactive ion etching (RIE) and/or an ion beam etching (IBE) process is conducted to remove the top electrode 50, MTJ stack 38, bottom electrode 42, and the IMD layer 30 in this embodiment for forming the MTJs 52. Due to the characteristics of the IBE process, the top surface of the remaining IMD layer 30 is slightly lower than the top surface of the metal interconnections 32 after the IBE process and the top surface of the IMD layer 30 also reveals a curve or an arc. Moreover, as the IBE process is conducted to remove part of the IMD layer 30, part of the metal interconnection 32 is removed at the same time to form inclined sidewalls on the surface of the metal interconnection 32 immediately adjacent to the MTJs 52.

It should also be noted that the top electrodes 50 disposed on the array regions 102, 104 are preferably made of TiN and it would be desirable to adjust the nitrogen to titanium (N/Ti) ratio in the top electrodes 50 before or after the aforementioned patterning process so that the top electrode 50 on the array region 102 and the top electrode 50 on the array region 104 would have different nitrogen to titanium (N/Ti) ratios. For instance, it would be desirable to form a patterned mask (not show) on the array region 104 before or after patterning the MTJ stack 38 for forming the MTJs 52, conduct an ion implantation process to implant nitrogen ions into the array region 102 or inject a nitrogen-containing gas into the array region 102, and then remove the patterned mask on the array region 104 so that the N/Ti ratio of the top electrode 50 on the array region 102 would be substantially higher than the N/Ti ratio of the top electrode 50 on the array region 104. In this embodiment, the N/Ti ratio of the top electrode 50 on the array region 102 is between 0.3 to 1.5 and most preferably at 1.09 while the N/Ti ratio of the top electrode 50 on the array region 104 is between 0.3 to 1.5 and most preferably at 0.99.

According to a first embodiment of the present invention, the top electrode 50 having higher nitrogen to titanium (N/Ti) ratio on the array region 102 could generate lower tunnel magnetoresistance (TMR) and such combination would be more suitable for memory blocks requiring higher operating speed in a MRAM unit. On the other hand, the top electrode 50 having lower N/Ti ratio on the array region 104 would generate higher TMR which would be more suitable for memory blocks requiring higher retention in a MRAM unit.

Next, a cap layer 56 is formed on the MTJs 52 while covering the surface of the IMD layer 30. In this embodiment, the cap layer 56 preferably includes silicon nitride, but could also include other dielectric material including but not limited to for example silicon oxide, silicon oxynitride (SiON), or silicon carbon nitride (SiCN).

Figure 3:
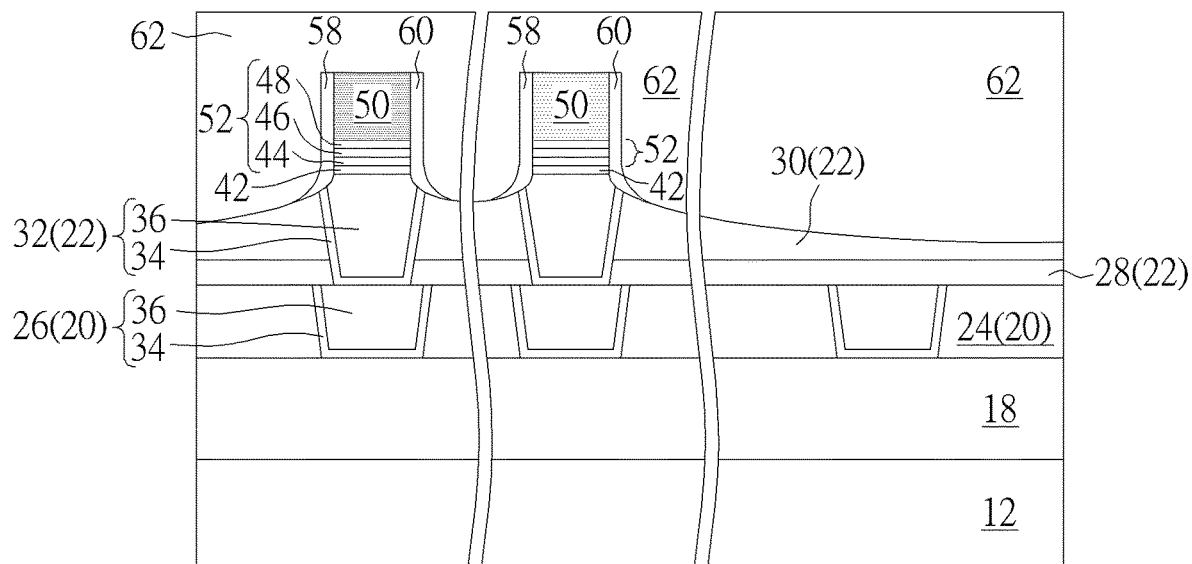

Next, as shown in FIG. 3, an etching back process is conducted to remove part of the cap layer 56 for forming spacers 58, 60 on sidewalls of each of the MTJs 52 and an inter-metal dielectric (IMD) layer 62 is formed on the MTJs 52 and the IMD layer 30 on the logic region 16. In this embodiment, the IMD layer 62 preferably include an ultra low-k (ULK) dielectric layer including but not limited to for example porous material or silicon oxycarbide (SiOC) or carbon doped silicon oxide (SiOCH). Since the top surface of the IMD layer 62 on the MRAM region 14 could be slightly higher than the top surface of the IMD layer 62 on the logic region 16 at this stage, a selective planarizing process such as chemical mechanical polishing (CMP) is conducted to remove part of the IMD layer 62 on the MRAM region 14 and logic region 16 without exposing the top surfaces of the top electrodes 50 so that the top surface of the IMD layer 62 on the MRAM region 14 is even with the top surface of the IMD layer 62 on the logic region 16.

Figure 4:
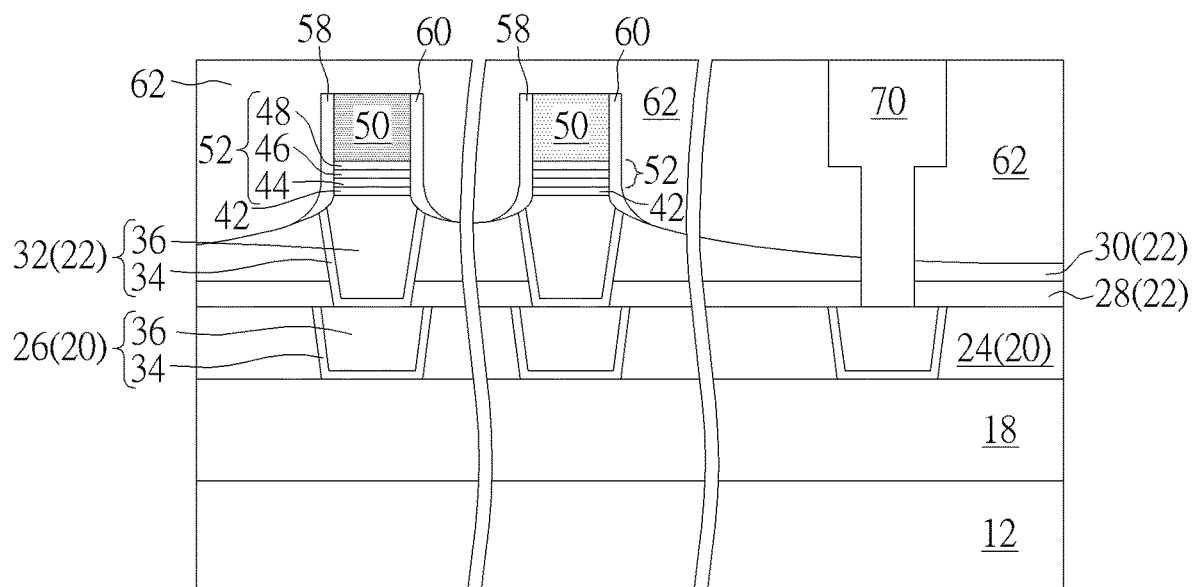

Next, as shown in FIG. 4, a pattern transfer process is conducted by using a patterned mask (not shown) to remove part of the IMD layer 62, part of the IMD layer 30, and part of the stop layer 28 on the logic region 16 to form a contact hole (not shown) exposing the metal interconnection 26 underneath and conductive materials are deposited into the contact hole afterwards. For instance, a barrier layer selected from the group consisting of titanium (Ti), titanium nitride (TiN), tantalum (Ta), and tantalum nitride (TaN) and metal layer selected from the group consisting of tungsten (W), copper (Cu), aluminum (Al), titanium aluminide (TiAl), and cobalt tungsten phosphide (CoWP) could be deposited into the contact hole, and a planarizing process such as CMP could be conducted to remove part of the conductive materials including the aforementioned barrier layer and metal layer to form a contact plug or metal interconnection 70 in the contact hole electrically connecting the metal interconnection 26.

Figure 5:
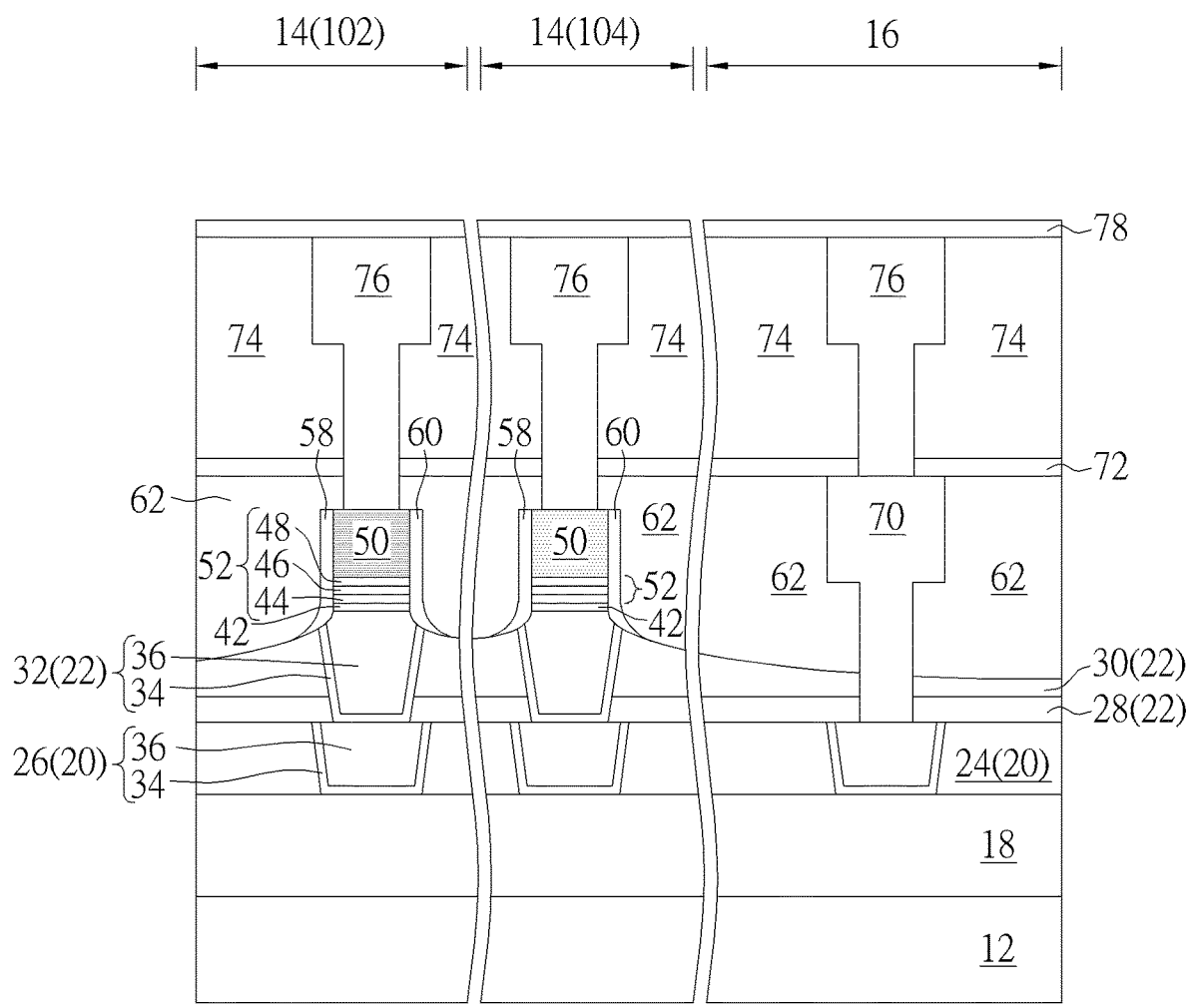

Next, as shown in FIG. 5, a stop layer 72 is formed on the MRAM region 14 and logic region 16 to cover the IMD layer 62 and metal interconnection 70, an IMD layer 74 is formed on the stop layer 72, and one or more photo-etching process is conducted to remove part of the 1 MB layer 74, part of the stop layer 72, and part of the IMD layer 62 on the MRAM region 14 and logic region 16 to form contact holes (not shown). Next, conductive materials are deposited into each of the contact holes and a planarizing process such as CMP is conducted to form metal interconnections 76 connecting the MTJs 52 and metal interconnection 70 underneath, in which the metal interconnections 76 on the array regions 102 and 104 directly contact the top electrodes 50 underneath while the metal interconnection 76 on the logic region 16 directly contacts the metal interconnection 70 on the lower level. Next, another stop layer 78 is formed on the 1 MB layer 74 to cover the metal interconnections 76.

In this embodiment, the stop layers 72 and 78 could be made of same or different materials, in which the two layers 72, 78 could all include nitrogen doped carbide (NDC), silicon nitride, silicon carbon nitride (SiCN), or combination thereof. Similar to the metal interconnections formed previously, each of the metal interconnections 76 could be formed in the IMD layer 74 through a single damascene or dual damascene process. For instance, each of the metal interconnections 76 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. This completes the fabrication of a semiconductor device according to an embodiment of the present invention.

Figure 6:
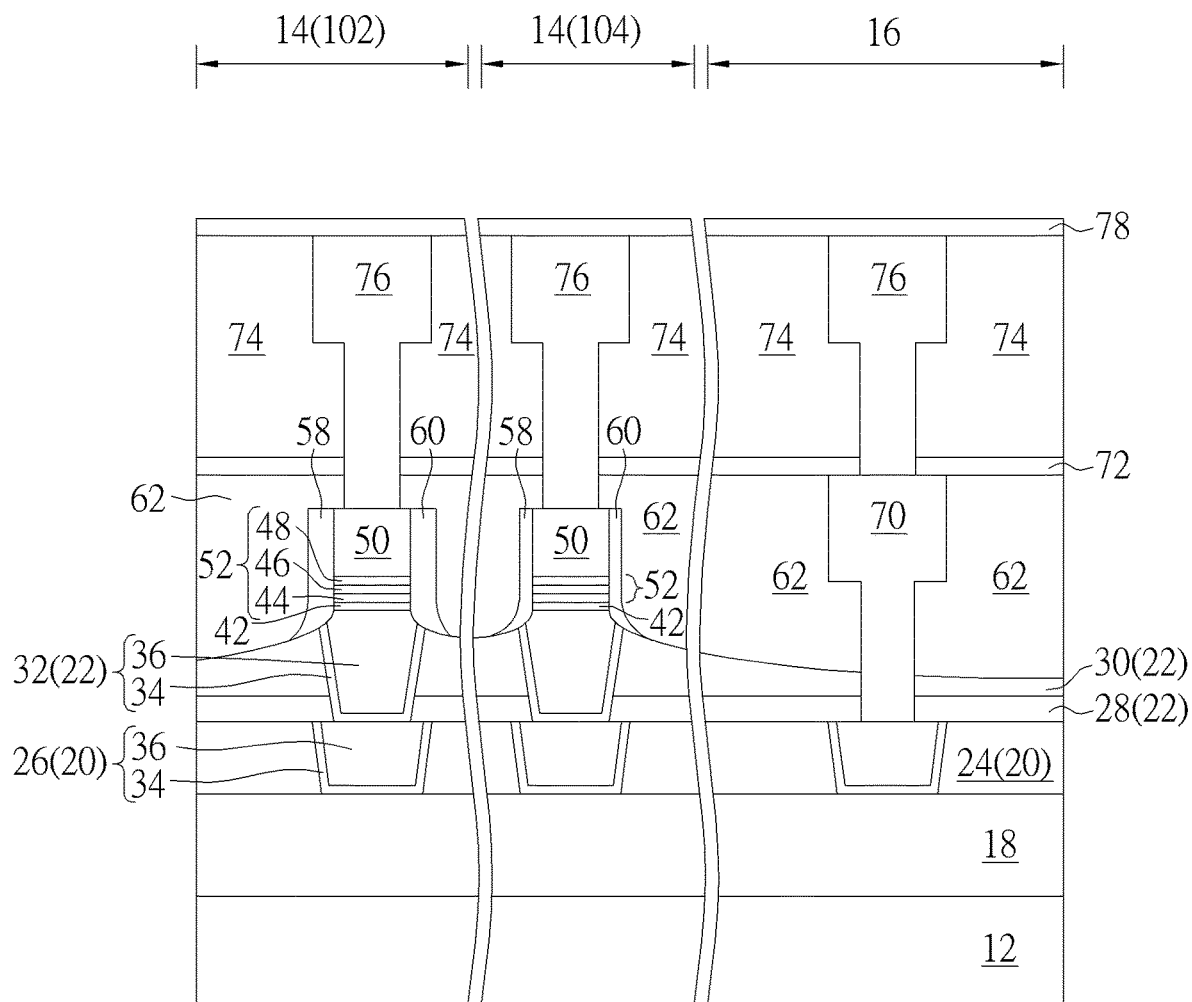
FIG. 6 illustrates a structural view of a semiconductor device according to an embodiment of the present invention.

Referring to FIG. 6, FIG. 6 illustrates a structural view of a semiconductor device according to an embodiment of the present invention. As shown in FIG. 6, in contrast to the spacers 58, 60 on the array region 102 and the spacers 58, 60 on the array region 104 having same thickness in the aforementioned embodiment, it would also be desirable to adjust the thickness of the spacers 58, 60 on each of the array regions 102, 104 during the formation of the spacers 58, 60 in FIG. 3 so that the spacers 58, 60 on the array region 102 and the spacers 58, 60 on the array region 104 would have different thicknesses. For instance, it would be desirable to first form a patterned mask (not shown) on the array region 102 after the spacers 58, 60 are formed and then conduct an etching process to remove part of the spacers 58, 60 on the array region 104 so that the thickness of each of the spacers 58, 60 on the array region 104 becomes slightly less than the thickness of each of the spacers 58, 60 on the array region 102. Next, the patterned mask is removed and the IMD layer 62 is formed on the spacers 58, 60 and metal interconnections are formed thereafter.

It should be noted that the thickness of the spacers 58, 60 on the array regions 102, 104 specifically refers to the width of each of the spacers 58, 60 extending along the direction of the top surface of the substrate 12 or top surface of the top electrodes 50, in which the thickness or width of each of the spacers 58, 60 on the array region 104 is less than the thickness or width of each of the spacers 58, 60 on the array region 102. Preferably, the thickness or width of each of the spacers 58, 60 on the array region 102 is twice or even three times thicker than the thickness or width of each of the spacers 58, 60 on the array region 104. Specifically, the thickness of each of the spacers 58, 60 on the regions 102, 104 is between 50-400 Angstroms, in which the thickness or width of each of the spacers 58, 60 on the array region 102 is between 330-400 Angstroms or most preferably 365 Angstroms while the thickness or width of each of the spacers 58, 60 on the array region 104 is between 60-120 Angstroms or most preferably 90 Angstroms.

Preferably, the top surfaces of the spacers 58, 60 and the top electrode 50 on the array region 102 are coplanar, the top surfaces of the spacers 58, 60 and the top electrode 50 on the array region 104 are coplanar, and the top surfaces of the spacers 58, 60 on the array regions 102 and 104 are coplanar. According to a second embodiment of the present invention, the top electrode 50 having thicker spacers 58, 60 on the array region 102 could generate lower tunnel magnetoresistance (TMR) and such combination would be more suitable for memory blocks requiring higher operating speed in a MRAM unit. On the other hand, the top electrode 50 having thinner spacers 58, 60 on the array region 104 would generate higher TMR which would be more suitable for memory blocks requiring higher retention in a MRAM unit.

Figure 7:
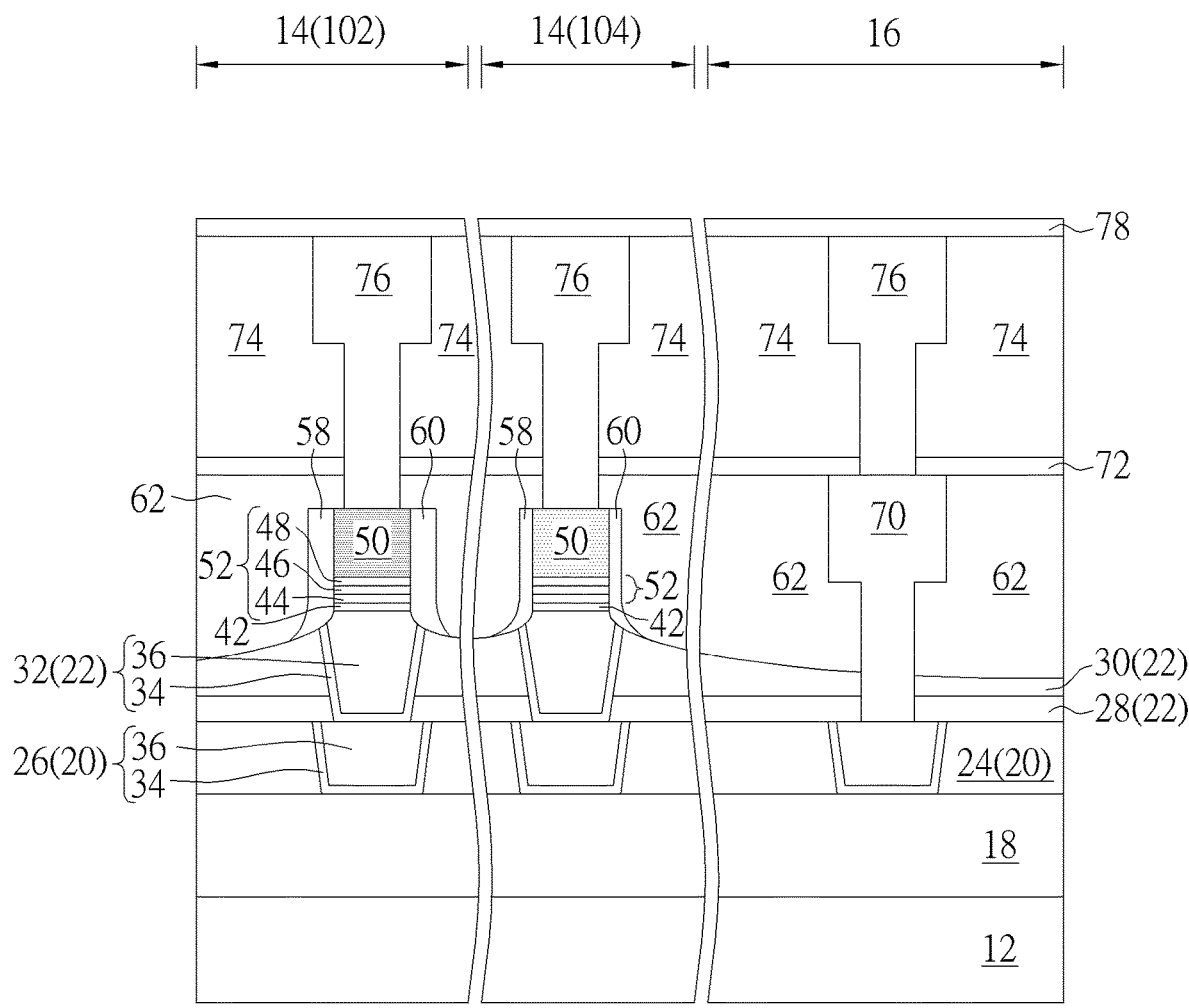
FIG. 7 illustrates a structural view of a semiconductor device according to an embodiment of the present invention.

Referring to FIG. 7, FIG. 7 illustrates a structural view of a semiconductor device according to an embodiment of the present invention. As shown in FIG. 7, in contrast to only having top electrode 50 on the array region 102 and the top electrode 50 on the array region 104 with different N/Ti ratios as shown in FIG. 5 or only having the spacers 58, 60 on the array regions 102, 104 with different thicknesses as shown in FIG. 6, it would also be desirable to combine the embodiments shown in FIGS. 5-6 so that not only the top electrodes 50 on the array regions 102, 104 having different N/Ti ratios but also the spacers 58, 60 on the array regions 102, 104 having different thicknesses or widths, which is also within the scope of the present invention.

Typically, critical dimension (CD) or perpendicular magnetic anisotropy (PMA) on different array regions of current MRAM devices could be changed to adjust the coercivity of free layer so that different array regions or memory blocks could be used for higher speed or higher retention applications as well as achieving fusions chips having hybrid memory functions. According to a first embodiment of the present invention, it would be desirable to adjust nitrogen to titanium (N/Ti) ratio of top electrodes on different array regions so that the MTJ with top electrode having higher N/Ti ratio could generate lower tunnel magnetoresistance (TMR) for memory blocks requiring higher operating speed while the MTJ with top electrode having lower N/Ti ratio could generate higher TMR for memory blocks requiring higher retention.

Moreover, according to a second embodiment of the present invention, it would be desirable to adjust the thickness or widths of the spacers on different array regions so that the array region or MTJ with thicker spacers on adjacent two sides could generate lower TMR for memory blocks requiring higher operating speed while the array region or MTJ with thinner spacers on adjacent two sides could generate higher TMR for memory blocks requiring higher retention.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A magnetic random access memory (MRAM) device, comprising:
   a first array region, a second array region, and a logic region on a substrate;
   a first magnetic tunneling junction (MTJ) on the first array region;
   a first spacer adjacent to the first MTJ;
   a second MTJ on the second array region;
   a second spacer adjacent to the second MTJ, wherein a maximum width of the first spacer adjacent to the first MTJ and a maximum width of the second spacer adjacent to the second MTJ are different; and
   a metal interconnection on the logic region.

2. The MRAM device of claim 1, wherein the first spacer and the second spacer comprise silicon nitride.

3. The MRAM device of claim 1, further comprising:
   a first top electrode on the first MTJ; and
   a second top electrode on the second MTJ.

4. The MRAM device of claim 3, wherein top surfaces of the first spacer and the first top electrode are coplanar.

5. The MRAM device of claim 3, wherein top surfaces of the second spacer and the second top electrode are coplanar.

* * * * *